United States Patent
Zhu et al.

(10) Patent No.: US 7,220,626 B2
(45) Date of Patent: May 22, 2007

(54) STRUCTURE AND METHOD FOR MANUFACTURING PLANAR STRAINED SI/SIGE SUBSTRATE WITH MULTIPLE ORIENTATIONS AND DIFFERENT STRESS LEVELS

(75) Inventors: Huilong Zhu, Poughkeepsie, NY (US); Bruce B. Doris, Brewster, NY (US); Philip J. Oldiges, Lagrangeville, NY (US); Meikei Ieong, Wappingers Falls, NY (US); Min Yang, Yorktown Heights, NY (US); Huajie Chen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 10/905,978

(22) Filed: Jan. 28, 2005

(65) Prior Publication Data
US 2006/0172495 A1 Aug. 3, 2006

(51) Int. Cl.
*H01L 21/84* (2006.01)
(52) U.S. Cl. .................. 438/154; 438/275; 438/459; 438/938; 257/E21.633
(58) Field of Classification Search ................ 438/154, 438/222, 275, 459, 933, 938; 257/E21.633
See application file for complete search history.

(56) References Cited

U.S. PATENT DOCUMENTS

| | | | |
|---|---|---|---|
| 3,602,841 | A | 8/1971 | McGroddy |
| 4,655,415 | A | 4/1987 | Miller et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |

(Continued)

FOREIGN PATENT DOCUMENTS

EP  1 174 928 A1  1/2002

(Continued)

OTHER PUBLICATIONS

Ootsuka, et al. "A Highly Dense, High-Performance 130nm node CMOS Technology for Large Scale System-on-a-Chip Application", International Electron Device Meeting, 23.5.1, IEEE, Apr. 2000.

(Continued)

*Primary Examiner*—Chandra Chaudhari
(74) *Attorney, Agent, or Firm*—Scully, Scott, Murphy & Presser, P.C.; Ira D. Blecker, Esq.

(57) ABSTRACT

The present invention provides a method of forming a semiconducting substrate including the steps of providing an initial structure having first device region comprising a first orientation material and a second device region having a second orientation material; forming a first concentration of lattice modifying material atop the first orientation material; forming a second concentration of the lattice modifying material atop the second orientation material; intermixing the first concentration of lattice modifying material with the first orientation material to produce a first lattice dimension surface and the second concentration of lattice modifying material the second orientation material to produce a second lattice dimension surface; and forming a first strained semiconducting layer atop the first lattice dimension surface and a second strained semiconducting layer atop the second lattice dimension surface.

16 Claims, 10 Drawing Sheets

U.S. PATENT DOCUMENTS

| | | | |
|---|---|---|---|
| 5,060,030 | A | 10/1991 | Hoke |
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,133,071 | A | 10/2000 | Nagai |
| 6,165,383 | A | 12/2000 | Chou |
| 6,177,722 | B1 | 1/2001 | Kovats et al. |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,476,462 | B2 | 11/2002 | Shimizu et al. |
| 6,486,513 | B1 * | 11/2002 | Matsumoto et al. ........ 257/347 |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,703,271 | B2 * | 3/2004 | Yeo et al. ................... 438/221 |
| 2001/0009784 | A1 | 7/2001 | Ma et al. |
| 2002/0030203 | A1 * | 3/2002 | Fitzgerald ................... 257/194 |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |

FOREIGN PATENT DOCUMENTS

| | | |
|---|---|---|
| JP | 01162362 | 6/1989 |
| WO | WO 94/27317 | 5/1993 |
| WO | WO 02/45156 A2 | 6/2002 |

OTHER PUBLICATIONS

Rim, et al. "Transconductance Enhancement in Deep Submicron Strained-Si $n$-MOSFETs", International Electron Devices Meeting, 26, 8, 1, IEEE, Sep. 1998.

Rim, et al. "Characteristics and Device Design of Sub-100 nm Strained Si N- and PMOSFETs", 2002 Symposium On VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Effect of <100> Channel Direction for High Performance SCE Immune pMOSFET with Less Than 0.15um Gate LengthULSI Development Center, pp. 27.5.1-27.5.4, 1999 IEEE, Sayama, et al.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC): A New Technique for CMOS-Performance Enhancement", International Electron Devices Meeting, IEEE, Mar. 2001.

Jeffrey A. Davis, et al., "Interconnect Limits on Gigascale Integration (GSI) in the 21$^{st}$ Century", *Proceedings of the IEEE*, vol. 89, No. 3, pp. 305-324 (2001).

"Grand Challenges", *The International Technology Roadmap For Semiconductors*, pp. 9-15 (2002).

* cited by examiner

STRUCTURE AND METHOD FOR MANUFACTURING PLANAR STRAINED SI/SIGE SUBSTRATE WITH MULTIPLE ORIENTATIONS AND DIFFERENT STRESS LEVELS

This application is related to co-assigned U.S. patent application Ser. No. 10/250,241 entitled HIGH PERFORMANCE SOI DEVICES ON HYBRID CRYSTAL-ORIENTATED SUBSTRATES, filed Jun. 17, 2003, and co-assigned U.S. patent application Ser. No. 10/710,277 (SSMP 17467, FIS920040052US1) entitled STRUCTURE AND METHOD FOR MANUFACTURING PLANAR SOI SUBSTRATE WITH MULTIPLE ORIENTATIONS, filed Jun. 30, 2004, the entire content and subject matter of which are incorporated herein by reference.

BACKGROUND OF INVENTION

The present invention relates to semiconductor materials having enhanced electron and hole mobilities, and more particularly, to semiconductor materials that include a silicon (Si)-containing layer having enhanced electron and hole mobilities. The present invention also provides methods for forming such semiconductor materials.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. A concise summary of near-term and long-term challenges to continued CMOS scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities. This can be done by either:

(1) introducing the appropriate strain into the Si lattice;
(2) by building MOSFETs on Si surfaces that are orientated in directions different than the conventional <100> Si; or
(3) a combination of (1) and (2).

As far as approach (1) is concerned, the application of stresses or strains changes the lattice dimensions of the Si-containing layer. By changing the lattice dimensions, the energy band gap of the material is changed as well. The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. Thus, the change in resistance of the material with stress is large.

Prior attempts to provide strain-based improvements of semiconductor substrates have utilized etch stop liners or embedded SiGe structures. N-type channel field effect transistors (nFETs) need tension on the channel for strain-based device improvements, while p-type channel field effect transistors (pFETs) need a compressive stress on the channel for strain-based device improvements.

In terms of approach (2), electrons are known to have a high mobility for a (100) Si surface orientation, but holes are known to have high mobility for a (110) surface orientation. That is, hole mobility values on (100) Si are roughly 2×–4× lower than the corresponding electron mobility for this crystallographic orientation. To compensate for this discrepancy, pFETs are typically designed with larger widths in order to balance pull-up currents against the nFET pull-down currents and achieve uniform circuit switching. NFETs having larger widths are undesirable since they take up a significant amount of chip area.

On the other hand, hole mobilities on the (110) crystal plane of Si are approximately 2× higher than on the (100) crystal plane of Si; therefore, pFETs formed on a surface having a (110) crystal plane will exhibit significantly higher drive currents than pFETs formed on a surface having a (100) crystal plane. Unfortunately, electron mobilities on the (110) crystal plane of Si are significantly degraded compared to the (100) crystal plane of Si.

There is interest in integrating strained substrates having multiple crystallographic orientations with silicon-on-insulator (SOI) technology. SOI substrates reduce parasitic capacitance within the integrated circuit, reduce individual circuit loads and reduce the incidence of latch-up, thereby improving circuit and chip performance.

In view of the state of the art mentioned above, there is a continued need for providing a strained Si/SiGe on insulator substrate with multiple crystallographic orientations and different stress levels.

SUMMARY OF THE INVENTION

One object of the present invention is to provide a multiple crystallographic orientation strained Si/SiGe-on-insulator (SGOI) substrate.

Another object of the present invention is to provide a SGOI substrate that integrates strained silicon nFETs on a (100) crystal plane with strained silicon pFETs on a (110) crystal plane.

These and other objects and advantages are achieved in the present invention by utilizing a method that provides a multiple orientation strained SGOI substrate including bonding, masking, etching and epitaxial regrowth process steps. Specifically, the method of the present invention comprises the steps of:

providing an initial structure having a first device region and a second device region positioned on and separated by an insulating material, said first device region comprising a first orientation material and said second device region comprising an insulating layer atop a second orientation material, wherein said first orientation material and said second orientation material have different crystallographic orientations;

forming a first concentration of lattice modifying material atop said first orientation material;

forming a protective layer atop said first concentration of lattice modifying material;

removing said insulating layer atop said second orientation material; forming a second concentration of said lattice modifying material atop said second orientation material;

removing said protective layer from said first concentration of lattice modifying material;

intermixing said first concentration of lattice modifying material with said first orientation material to produce a first lattice dimension surface and said second concentration of lattice modifying material with said second orientation material to produce a second lattice dimension surface; and forming a first strained semiconducting layer atop said first lattice dimension surface and a second strained semiconducting layer atop said second lattice dimension surface, said first strained semiconducting layer having a same or a different internal stress than said second semiconducting layer, said second strained semiconducting layer having a different crystallographic orientation than the first semiconducting layer.

In accordance with the present invention, the lattice modifying material may comprise SiGe. Increasing the Ge concentration in the lattice modifying material, increases the strain produced in the subsequently formed first strained semiconducting layer and second strained semiconducting layer. The concentration of Ge present in the lattice modifying material atop the first device region and the second device region can be controlled using deposition, photolithography and etching.

A first concentration of lattice modifying material is epitaxially grown atop the first orientation material in the first device region. Epitaxial growth requires a crystalline silicon-containing surface; therefore the first concentration of lattice modifying material does not grow atop the insulating layer in the second device region. A protective layer is then blanket deposited atop at least the first device region and the second device region. A protective mask is then formed atop a portion of the protective liner that is positioned on the first concentration of lattice modifying material in the first device region. The protective layer and the insulating layer are then removed from the second device region to expose the second orientation material.

Once the second orientation material is exposed, the second concentration of lattice modifying material is epitaxially grown atop the second orientation material in the second device region, while the remaining portion of the protective layer ensures that epitaxial growth does not occur in the first device region. Thereafter, the remaining portion of the protective layer is removed.

In a next process step, thermal processing of the structure in an oxidizing environment causes intermixing between the lattice modifying materials and the underlying first orientation material and second orientation material to produce a first lattice dimension surface and second lattice dimension surface capped with an oxidation layer.

Following the removal of the oxidation layer, a first strained semiconducting layer can be formed atop the first lattice dimension surface and a second strained semiconducting material can be formed atop the second orientation material. The Ge concentration and the crystallographic orientation in the first and second strained semiconducting layers may be independently selected to provide optimized device regions for both pFET or nFET devices.

In another embodiment of the present invention, a method is provided for producing a multiple orientation strained Si/SiGe-on-insulator (SGOI) substrate in which the initial structure utilized in the method does not include an insulating layer atop the second orientation material within the second device region as disclosed above. Broadly, the inventive method comprises: providing an initial structure having a first device region and a second device region positioned on and separated by an insulating material, said first device region comprising a first orientation material and said second device region comprises a second orientation material, wherein said first orientation material and said second orientation material have different crystallographic orientations;

forming a protective layer atop said second orientation material;

forming a first concentration of lattice modifying material atop the first orientation material;

removing said protective layer to expose said second orientation material;

forming a protective liner atop said first concentration of lattice modifying material;

forming a second concentration of said lattice modifying material atop said second orientation material;

intermixing said first concentration of lattice modifying material with said first orientation material to produce a first lattice dimension surface and said second concentration of lattice modifying material with said second orientation material to produce a second lattice dimension surface; and forming a first strained semiconducting layer atop said first lattice dimension surface and a second strained semiconducting layer atop said second lattice dimension surface, said first strained semiconducting layer having a same or a different internal stress than said second semiconducting layer, said second strained semiconducting layer having said different crystallographic orientation than said first strained semiconducting layer.

Another aspect of the present invention is an inventive multiple orientation strained Si/SiGe-on-insulator (SGOI) substrate formed by the above methods. Broadly the inventive structure comprises: an insulating layer atop a substrate; an SOI layer atop the insulating layer, the SOI layer comprising a first lattice dimension material and a second lattice dimension material separated by an insulating material, wherein the first lattice dimension material has a lattice constant different than the second lattice dimension material;

a first strained semiconducting layer atop the first lattice dimension material, the first strained semiconducting material having a first crystallographic orientation; and a second strained semiconducting layer atop the second lattice dimension material, the second strained semiconducting material having a second crystallographic orientation different from the first crystallographic orientation.

In accordance with the present invention, the first strained semiconducting layer further comprises at least one pFET device and the second strained semiconducting layer further comprises at least one nFET device, when the first crystallographic orientation has a (110) crystal plane, the second crystallographic orientation has a (100) crystal plane and the first strained semiconducting layer has a higher internal stress than the second strained semiconducting layer. In another embodiment of the present invention, the lattice constant of the first lattice dimension material may be the same as the lattice constant of the second lattice dimension material.

DETAILED DESCRIPTION

Figure 1:
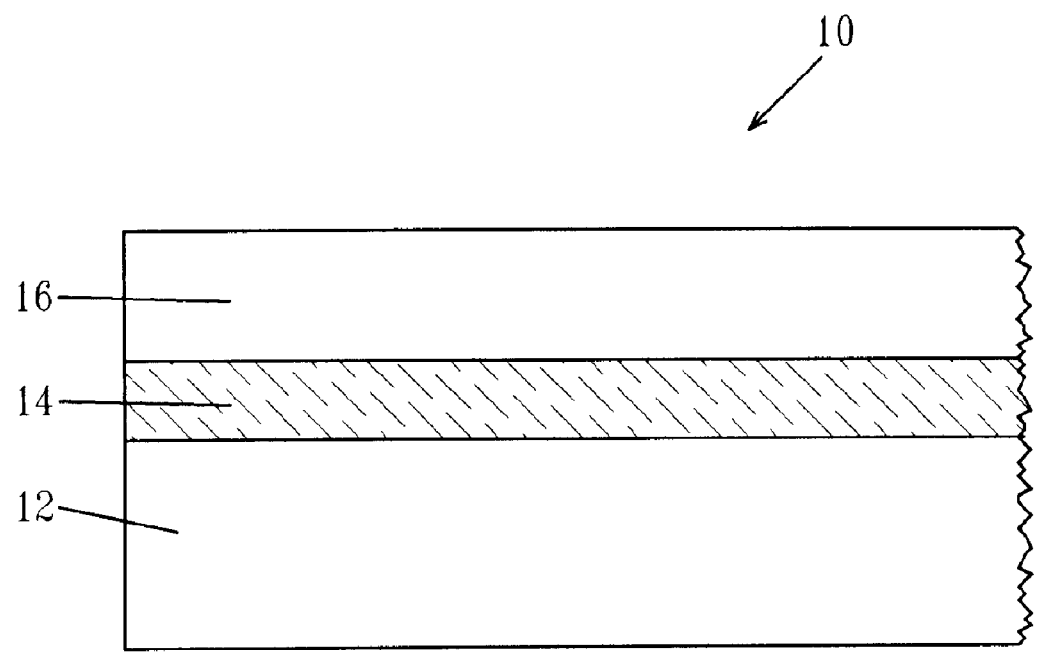
FIGS. 1–10 are pictorial representations (through cross sectional views) illustrating the basic processing steps utilized in one embodiment of the present invention to form a strained SGOI substrate having multiple crystallographic orientation planes.

The present invention, which provides a method of forming a SGOI substrate having different crystallographic surfaces, will now be described in greater detail by referring to the following discussion as well as the drawings that accompany the present application. In the accompanying drawings, like and correspondence elements are referred to by like reference numerals.

The first embodiment of the present invention is now described with reference to FIGS. 1–11. This embodiment provides a strained SGOI substrate comprising device regions separated by insulating material, in which each device region has a crystallographic orientation and internal stress that is optimized for a specific type of semiconducting device. For example, the following method can provide a first device region having a crystallographic orientation and internal stress that is optimized for pFET devices and a second device region having a crystallographic orientation and internal stress that is optimized for nFET devices.

Reference is first made to the initial structure shown in FIG. 1, in which a bonded substrate 10, i.e., hybrid substrate, is provided. As shown, bonded substrate 10 includes a first semiconductor layer 16, a first insulating layer 14, and a second semiconductor layer 12. The bonded substrate 10 may be formed using conventional thermal bonding methods.

The first semiconductor layer 16 is comprised of any semiconducting material including, for example, Si, SiC, SiGe, SiGeC, Ge alloys, GaAs, InAs, InP as well as other III/V or II/VI compound semiconductors. First semiconductor layer 16 may also comprise an SOI layer of a preformed SOI substrate or a layered semiconductor such as, for example, Si/SiGe. The first semiconductor layer 16 has a first crystallographic orientation, preferably having a (100) crystal plane. Although a (100) crystal plane is preferred, the first semiconductor layer 16 may alternatively have a first crystallographic orientation having a (111) crystal plane, a (110) crystal plane or other crystal planes.

The thickness of the first semiconductor layer 16 may vary depending on the initial starting wafers used to form the bonded substrate 10. Typically, however, the first semiconductor layer 16 has a thickness from about 5 nm to about 500 nm, with a thickness from about 5 nm to about 100 nm being more highly preferred.

The first insulating layer 14 which is located between the first semiconductor layer 16 and the second semiconductor layer 12 has a variable thickness depending upon the initial wafers used to create the bonded substrate 10. Typically, however, the first insulating layer 14 has a thickness from about 10 nm to about 500 nm, with a thickness from about 20 nm to about 100 nm being more highly preferred. The first insulating layer 14 is a nitride, oxide or other like insulator material, preferably a nitride, such as $Si_3N_4$.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III/V or II/VI compound semiconductors. Second semiconductor layer 12 may also comprise an SOI layer of a preformed SOI substrate or a layered semiconductor such as, for example, Si/SiGe. The second semiconductor layer 12 has a second crystallographic orientation, which is different from the first crystallographic orientation. Since the first semiconductor layer 16 is preferably a surface having a (100) crystal plane, the second semiconductor layer 12 preferably has a crystallographic orientation having a (110) crystal plane or other crystal planes. Although the second crystallographic orientation of the second semiconductor layer 12 preferably has a (110) crystal plane, the second semiconducting layer 12 may alternatively have a (111) crystal plane, a (100) crystal plane or other crystal planes.

In a first process step, an etch mask is formed on a predetermined portion of the first semiconductor layer 16, so as to protect a portion of the bonded substrate 10, while leaving another portion of the bonded substrate 10 unprotected. The etch mask may comprise a photoresist or be a single or multi-layer dielectric hardmask. The unprotected portion of the bonded substrate 10 defines a first device area 24 of the structure, whereas the protected portion of the bonded substrate 10 defines a second device region 22. After providing the etch mask, the structure is subjected to one or more etching steps so as to expose a surface of the second semiconductor layer 12. Specifically, the one or more etching steps used at this point of the present invention removes the unprotected portions of the first semiconductor layer 16 and the insulating layer 14, stopping on the second semiconducting layer 12. The etching used at this point of the present invention may include a dry etching process, such as reactive-ion etching, ion beam etching, plasma etching or laser etching. The etch mask is then removed.

Figure 2:
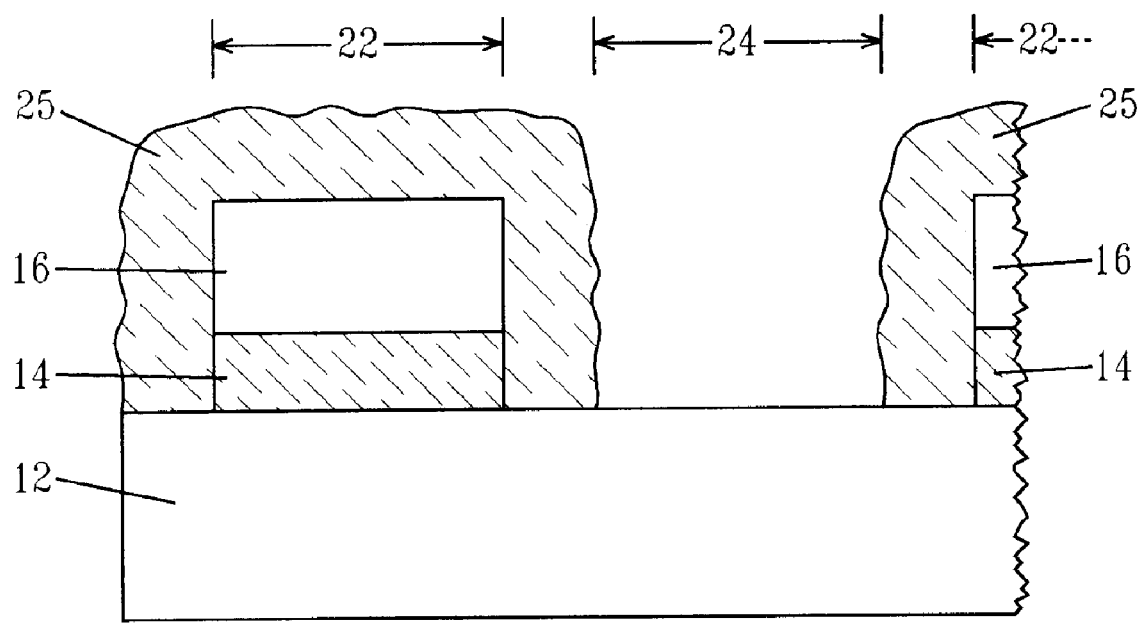

Insulating material 25 is then formed atop and on the exposed sidewalls of the remaining portions of the first semiconductor layer 16 and the first insulating layer 14 in the second device region 22, as depicted in FIG. 2. The insulating material 25 is formed by deposition and etching and can be comprised of any insulator, such as, for example, an oxide.

Figure 3:
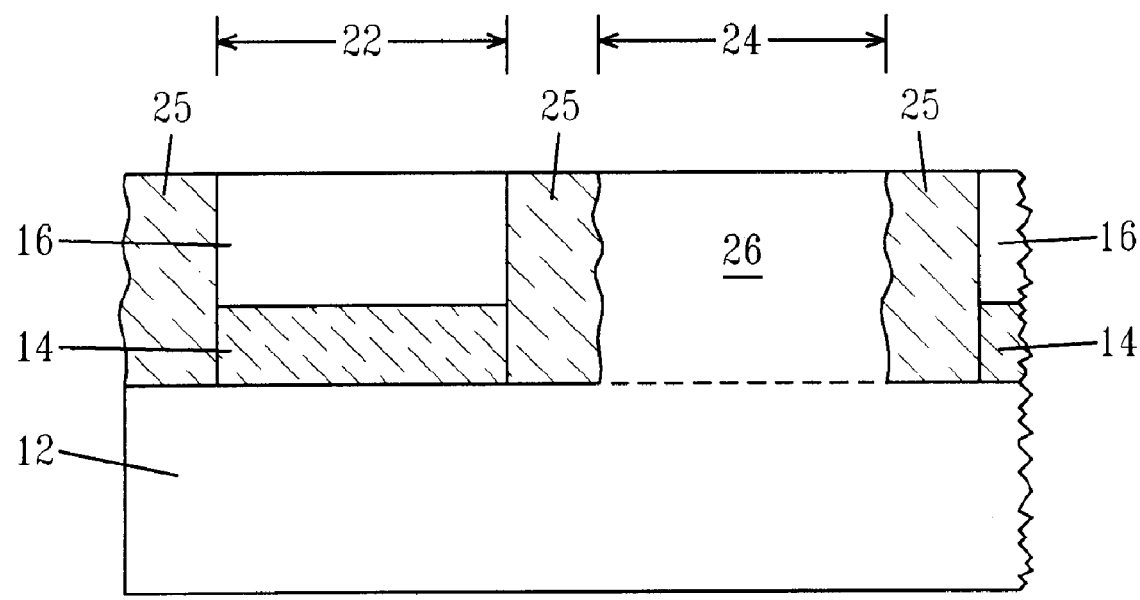

Referring to FIG. 3, a semiconductor material 26 is then epitaxially grown in the first device region 24, on the exposed surface of the second semiconductor layer 12. In accordance with the present invention, semiconductor material 26 has a crystallographic orientation that is the same as the crystallographic orientation of the second semiconductor layer 12. Preferably, the crystallographic orientation of the regrown semiconductor material 26 has a (110) crystal plane. Although a (110) crystal orientation is preferred, the regrown semiconductor material 26 may alternatively have a (111), or a (100) crystal plane.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In the present invention, semiconductor material 26 may be referred to as a regrown semiconductor material 26.

In a next process step, a planarization process, such as chemical mechanical polishing (CMP) or grinding, planarizes the upper surface of the regrown semiconductor material 26 to be substantially planar with the upper surface of the first semiconductor layer 16, as depicted in FIG. 3.

Figure 4:
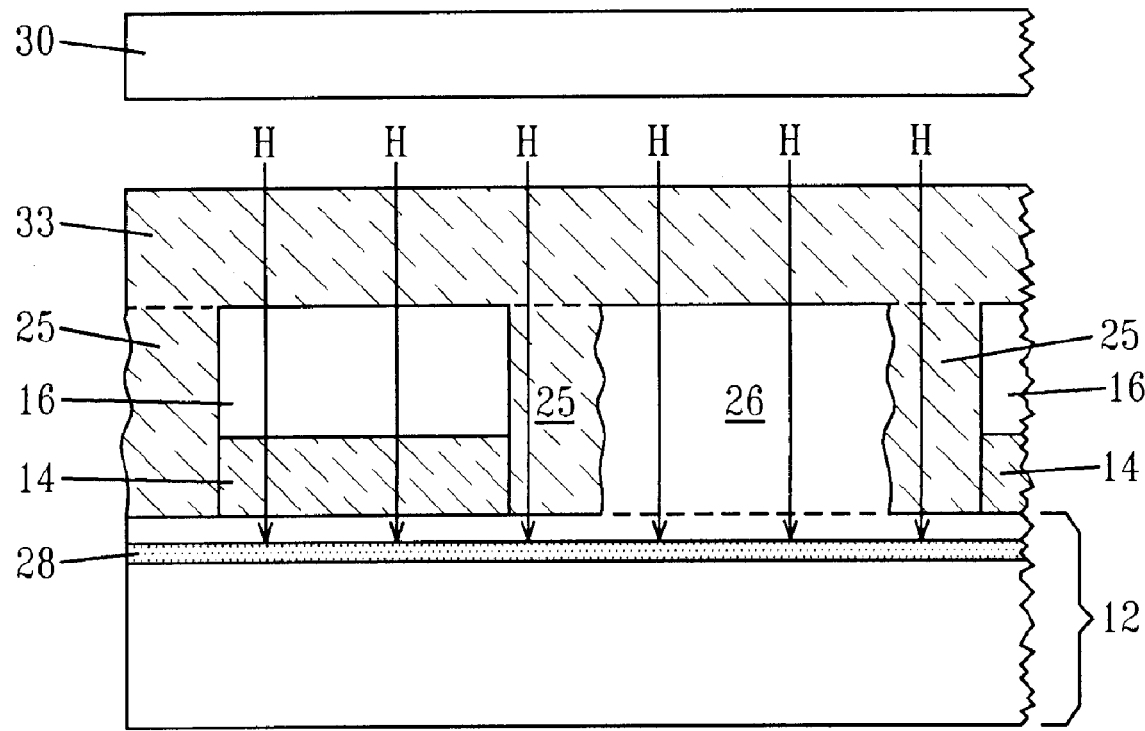

Referring to FIG. 4, in a next process step, a damage interface 28 is formed within the first semiconductor layer 12 by implanting hydrogen ions, or other like ions, into the first semiconductor layer 12. The hydrogen ions may be implanted by conventional ion implantation using a dosage ranging from about $1 \times 10^{16}$ atoms/cm$^2$ to about $2 \times 10^{17}$ atoms/cm². The hydrogen atoms may be implanted using an implantation energy ranging from about 50 keV to about 150 keV.

Following the formation of the damaged interface 28, a planar bonding layer 33, comprising an insulating layer, is formed on the upper surface of the structure depicted in FIG. 3. The planar bonding layer 33 is formed using conventional deposition and planarization. Specifically, an insulating layer is formed using a conventional deposition process, such as chemical vapor deposition. The insulating layer is then planarized to produce the planar bonding layer 33 using a conventional planarization method, such as CMP.

Still referring to FIG. 4, a wafer 30 is then bonded to the planar bonding layer 33. Bonding is achieved by bringing the wafer 30 into intimate contact with the face of the planar bonding layer 33;

optionally applying an external force to the contacted wafer 30 and planar bonding layer 33; and then heating the two contacted surfaces under conditions that are capable of bonding.

The heating step may be performed in the presence or absence of an external force. During bonding, the second semiconductor layer 12 is then separated about the damaged interface 28 of the second semiconductor layer 12, in which a portion of the second semiconductor layer 12 positioned below the damaged interface 28 is removed and a portion of the second semiconductor layer 12 above the damaged interface 28 remains.

Figure 5:
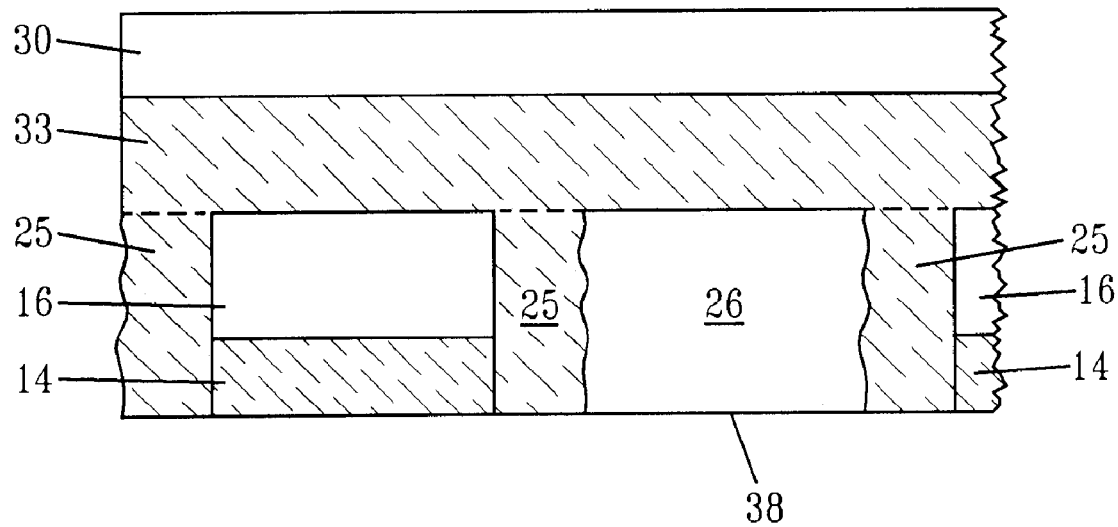

The remaining portion of the second semiconductor layer 12 is then subjected to a planarization process, such as chemical mechanical polishing (CMP) or grinding. The planarization process removes the remaining portion of the second semiconductor layer 12 stopping on the first insulating layer 14 and exposing a surface 38 of the regrown semiconducting material 26. FIG. 5 depicts the resultant structure formed by the above planarization process.

Figure 6:
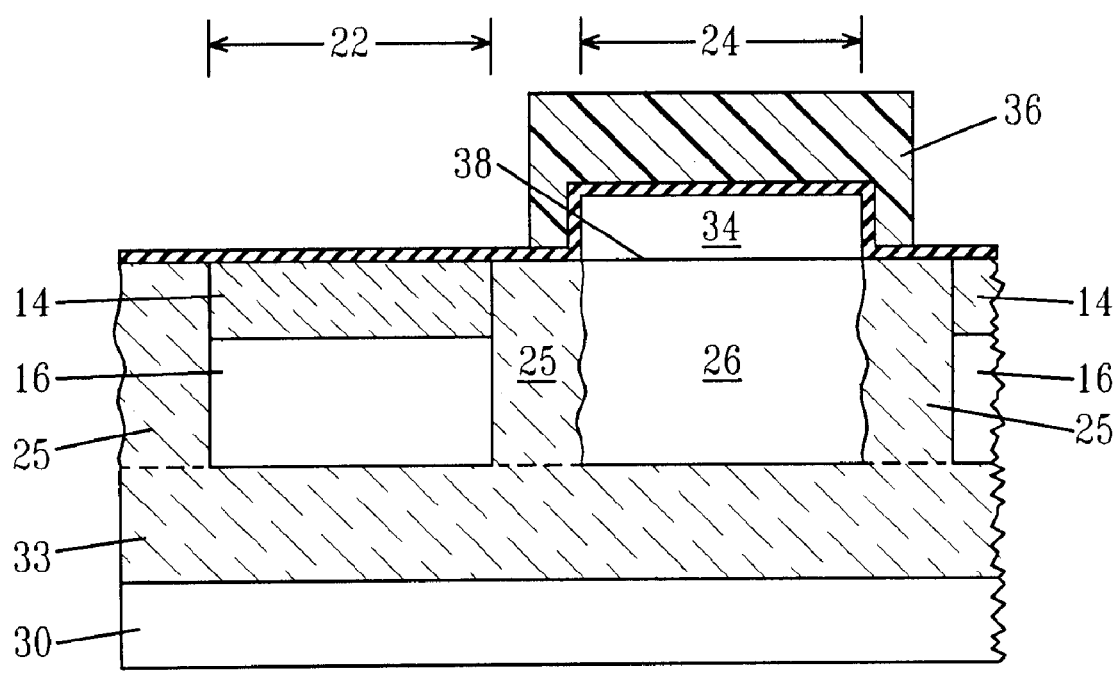

Referring to FIG. 6, in a next process step, a first SiGe layer 34 is grown atop the exposed surface 38 of the regrown semiconducting material 26 in the first device region 24 using a selective epitaxial growth process. The first SiGe layer 34 only grows on the exposed surface 38 of the regrown semiconducting material 26, since SiGe formed by selective epitaxial growth requires a silicon-containing surface. Therefore, since the exposed surface of the second device region 22 is the first insulating layer 14, the first SiGe layer 34 does not grow within the second device region 22.

Preferably, the first SiGe layer 34 is grown having a first Ge concentration ranging from about 20 atomic number % to about 40 atomic number %, where the concentration of Ge is selected to produce the appropriate stress within the subsequently formed first strained semiconducting layer for a pFET device. Alternatively, the SiGe layer 34 is grown having a first Ge concentration ranging about 5 atomic number % to about 30 atomic number %, where the concentration of Ge is selected to produce the appropriate strain within the subsequently formed first strained semiconducting layer for an pFET device. Alternatively, the Ge concentration may range from 0 atomic number % to 100 atomic number %. The first SiGe layer 34 may also be referred to as the first concentration of lattice modifying material.

Still referring to FIG. 6, a protective layer 35 is then formed atop the first device region 24, including the first SiGe layer 34, and the second device region 22. The protective layer 35 comprises an insulating material, preferably a nitride such as Si₃N₄. The protective layer 35 may be formed using deposition methods including, but not limited to: chemical vapor deposition (CVD), low-pressure chemical vapor deposition (LPCVD), plasma enhanced chemical vapor deposition (PECVD) or rapid thermal chemical vapor deposition (RTCVD). The protective layer 35 may have a thickness ranging from about 10 nm to about 20 nm.

Following the formation of the protective layer 35, a photoresist block mask 36 is formed overlying at least the first SiGe layer 34. The photoresist block mask 36 may be formed by conventional deposition and photolithography. For example, a layer of photoresist may be blanket deposited atop the surface of the entire structure including the first and second device regions 24, 22. The layer of photoresist is then patterned using conventional photolithography. Specifically, the layer of photoresist is patterned by exposing the photoresist layer to a pattern of radiation and then developing the pattern into the photoresist utilizing a conventional resist developer. Once the patterning of the photoresist layer is completed, the second device region 22 is exposed, while the photoresist block mask 36 protects the first device region 24.

Following the formation of the photoresist block mask 36, the protective layer 35 and the insulating layer 14 are removed from the second device region 22 to expose the first semiconductor layer 16. Preferably, the insulating layer 14 and the protective layer 35 are removed from the second device region 22 by a directional etch process, such as reactive ion etch, having high selectivity to removing the insulating layer 14 and protective layer 35, without substantially etching the insulating material 25, the photoresist block mask 36, and the first semiconductor layer 16.

Figure 7:
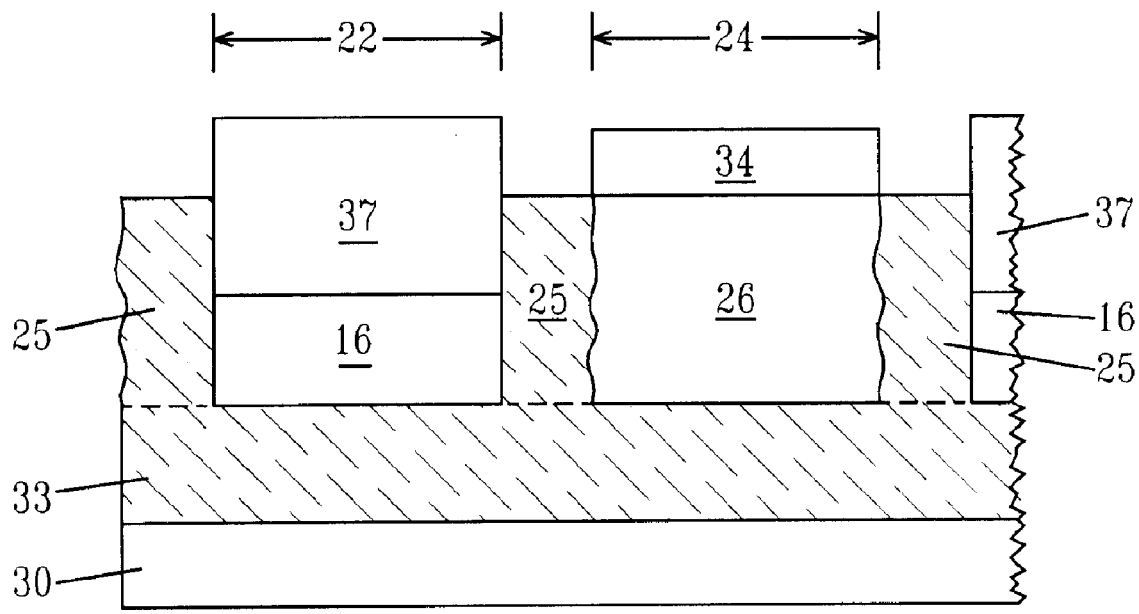

Referring to FIG. 7, in a next process step, a second SiGe layer 37 is grown atop the first semiconductor layer 16 in the second device region 22 using a selective epitaxial growth process. The second SiGe layer 37 only grows on the surface of the first semiconductor layer 16, since epitaxially growth SiGe requires a silicon-containing surface. Therefore, since the protective layer 35 is positioned atop the first device region 24, the second SiGe layer 37 will not grow within the first device region 24.

Preferably, the second SiGe layer 37 is grown having a second Ge concentration ranging from about 5% to about 30%, where the concentration of Ge is selected to produce the appropriate stress within the subsequently formed second strained semiconducting layer for a nFET device. Alternatively, the second SiGe layer 37 is grown having a second Ge concentration ranging about 20% to about 40%, where the concentration of Ge is selected to produce the appropriate stress within the subsequently formed second strained semiconducting layer for a pFET device. In a preferred embodiment, the second Ge concentration in the second SiGe layer 37 is different from the first Ge concentration in the first SiGe layer 34. Alternatively, the second Ge concentration may be the same as the first Ge concentration. The second SiGe layer 37 may also be referred to as the second concentration of lattice modifying material.

The structure is then planarized using conventional planarization processes, such as chemical mechanical polishing, stopping on the protective liner 35. The protective liner 35 is then removed by a highly selective etch that removes the protective liner 35 without substantially etching the first SiGe layer 34, the second SiGe layer 37, or the insulating material 25, producing the structure depicted in FIG. 7.

Figure 8:
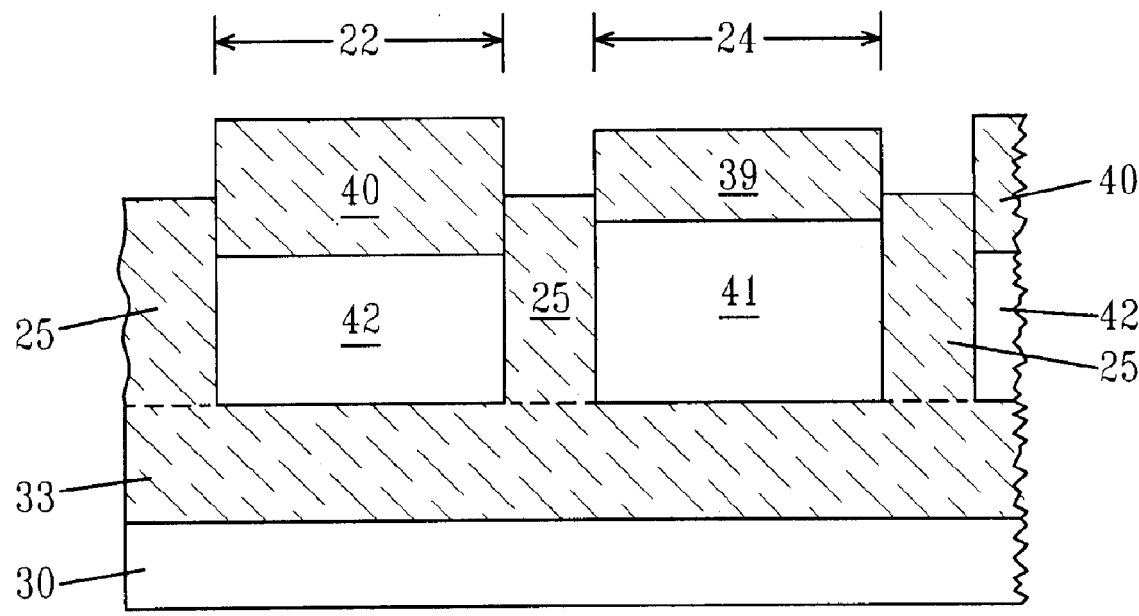
Figure 9:
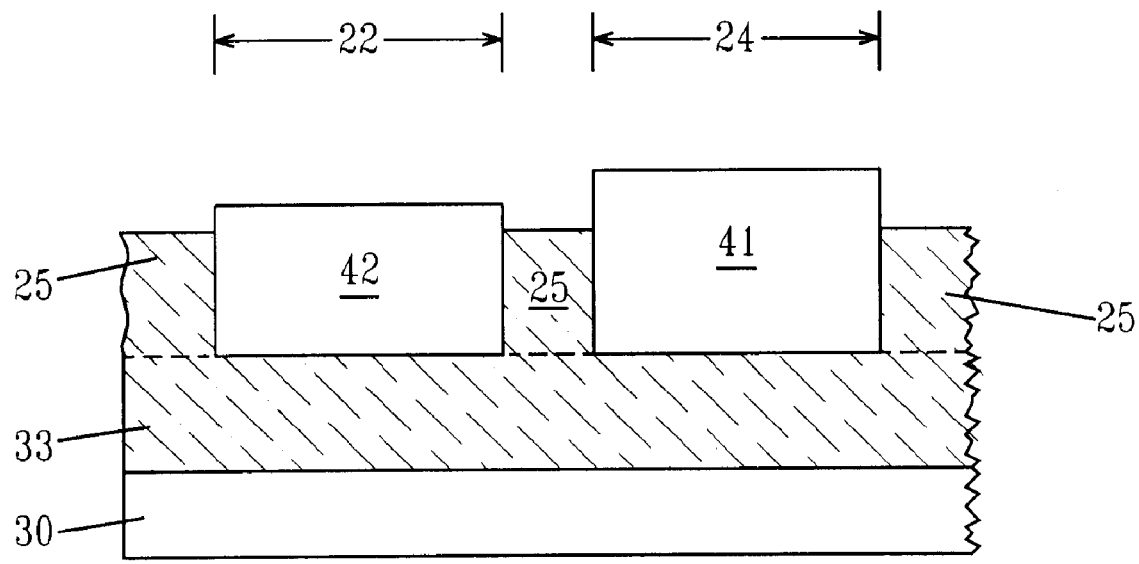

Referring to FIG. 8, the structure is then annealed in an oxidizing atmosphere to form a first thermal oxide 39 on the surface of the first device region 24 and a second thermal oxide 40 on the surface of the second device region 22. This annealing process may be conducted in an oxidizing atmosphere at a temperature ranging from about 1000° C. to about 1200° C. for a time period ranging from about 1 hour to 2 hours. Preferably, the first thermal oxide 39 and the second thermal oxide 40 comprise $SiO_2$ and have a thickness ranging from about 30 nm to about 100 nm.

During thermal oxidation of the first device region 24 and the second device region 22, the first SiGe layer 34 intermixes with the regrown semiconductor material 26 to form the first lattice dimension SiGe layer 41 and the second SiGe layer 37 intermixes with the first semiconductor layer 16 to form the second lattice dimension SiGe layer 42. More specifically, the first thermal oxide 39 formed atop the first device region 24 drives the Ge from the first SiGe layer 34 into the regrown semiconducting layer 26 and the second thermal oxide 40 drives the Ge from the second SiGe layer 37 into the first semiconductor layer 16.

The first lattice dimension SiGe layer 41 preferably has a lattice dimension that produces the appropriate strain for nFET device improvements in the subsequently formed first strained semiconductor layer, which is formed atop the first lattice dimension SiGe layer 41. The second lattice dimension SiGe layer 42 has a lattice dimension that produces the appropriate strain in the subsequently formed second strained semiconductor layer for optimized performance in pFET devices, in which the subsequently formed second strained semiconductor layer is epitaxially grown atop the second lattice dimension SiGe layer 42. In the preferred embodiment, the first lattice dimension SiGe layer 41 has a different lattice dimension (also referred to as lattice constant) than the second lattice dimension SiGe layer 42. Alternatively, the first lattice dimension SiGe layer 41 can have the same lattice dimension as the second lattice dimension SiGe layer 42. The crystallographic orientation of the regrown semiconductor material 26 and the epitaxially grown first SiGe layer 34 is maintained in the first lattice dimension SiGe layer 41. The crystallographic orientation of the first semiconductor layer 16 and the epitaxially grown second SiGe layer 37 is maintained in the second lattice dimension SiGe layer 42.

The first thermal oxide 39 and the second thermal oxide 40 are then removed using a highly selective etch process to expose the first lattice dimension SiGe layer 41 and the second lattice dimension SiGe layer 42. Preferably, the highly selective etch process is a timed directional etch process, such as reactive ion etch, having a high selectivity for etching the first thermal oxide 39 and the second thermal oxide 40, without substantially etching the first lattice dimension SiGe layer 41 and the second lattice dimension SiGe layer 42.

In one embodiment, an oxide layer may be deposited atop the structure and planarized by conventional planarization methods, such as chemical mechanical polishing (CMP), prior to the removal of the first thermal oxide 39 and the second thermal oxide 30. In this embodiment, the oxide layers are also removed by the etch process that exposes the first lattice dimension SiGe layer 41 and the second lattice dimension SiGe layer 42.

Figure 10:
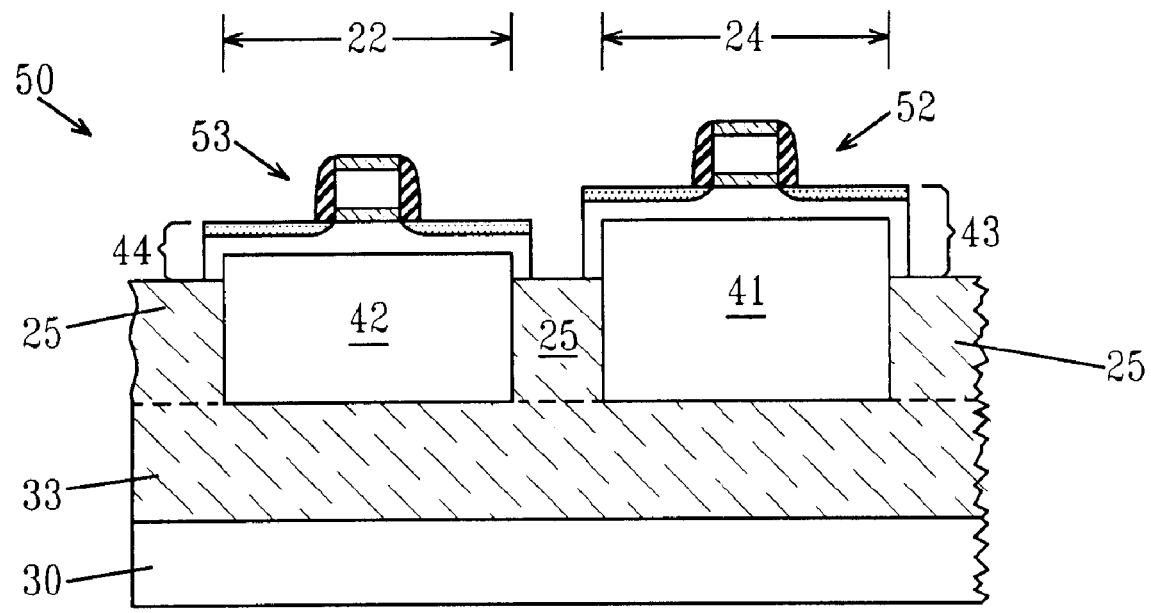

Referring to FIG. 10, in a next process step, a first strained semiconducting layer 43 is epitaxially grown atop the first lattice dimension SiGe layer 41 and a second strained semiconducting layer 44 is epitaxially grown atop the second lattice dimension SiGe layer 42. The first and second strained semiconducting layers 43, 44 comprise epitaxially formed Si.

The first and second strained semiconducting layer 43, 44 comprise an internal tensile stress. The internal tensile stress results from growing a material layer, such as the first and second semiconducting layer 43, 44, having a different lattice dimension than the surface on which the material layer is grown, such as the first or second lattice dimension SiGe layer 41, 42. An internal tensile stress is produced since the lattice dimension of the material layer is strained to match the lattice dimension of the surface on which the material layer is grown.

The internal stress produced within the first or second semiconducting layer 43, 44 is increased by increasing the Ge content in the first or second lattice dimensions SiGe layer 41, 42. Silicon has a lattice dimension of approximately 5.43 Å, and Ge has a lattice structure on the order of about 5.65 Å. Therefore, increasing the Ge concentration in the first lattice dimension SiGe layer 41 or the second lattice dimension SiGe layer 42 increases the lattice mismatch between the unstrained Si and the first lattice dimension or second lattice dimension SiGe layer 41, 42, which in turn increases the internal stress within the epitaxially grown Si 43, 44. Strain introduced to the device channel can result in device improvements for both pFET and nFET devices, in which pFET devices need higher strain levels for device optimization.

The strain produced in the first or second strained semiconducting layer 43, 44 is maintained so long as the first or second strained semiconducting layer 43, 44 is not grown to a thickness greater than its critical thickness. Once the first or second strained semiconducting layer 43, 44 surpasses its critical thickness, relaxation can occur due to dislocation generation. Relaxation diminishes the internal strain produced in the deposited layer. The "critical thickness" is the maximum thickness at which the layer will not relax. The thickness of the first strained semiconducting layer 43 may range from about 5 nm to about 20 nm. The thickness of the second strained semiconducting layer 44 may range from about 5 nm to about 20 nm.

In a preferred embodiment, the crystallographic orientation of the first lattice dimension SiGe layer 41 is (110). Although a (110) crystal plane is preferred, the first lattice dimension SiGe layer 41 may alternatively have a (111), or a (100) crystal plane. Since the first lattice dimension SiGe layer 41 is preferably in a (110) crystal plane surface, the crystallographic orientation of the second lattice dimension SiGe layer 42 is preferably in a (100) crystal plane. The second lattice dimension SiGe layer 42 may alternatively have a (111) crystal plane, a (110) crystal plane or other crystal planes.

Still referring to FIG. 10, the resulting structure comprises an SGOI substrate including a first device region 24 having a first strained semiconducting layer 43 with a first crystallographic orientation and a second device region 22 having a second strained semiconducting layer 44 with second crystallographic orientation, the first crystallographic orientation being different from the second crystallographic orientation. The internal strain within the first strained semiconductor layer 43 may be the same or different from the internal strain within the second strained semiconductor layer 44.

Preferably, the first strained semiconducting layer 43 has a crystallographic orientation and internal tensile stress for nFET device optimization. More specifically, the first crystallographic orientation is preferably in a (110) crystal plane and the internal tensile stress produces dislocations that are beneficial to pFET device performance. The second strained semiconducting layer 44 of the second device region 22 preferably has a crystallographic orientation and internal stress for nFET device optimization. More specifically, the second crystallographic orientation is preferably in a (100)

crystal plane to increase electron mobility and the internal stress avoids dislocation formation that degrades nFET device performance.

Still referring to FIG. 10, the SGOI substrate 50 may then be further processed using conventional MOSFET processing steps to form at least one pFET device 52 in first device region 24 and at least one nFET device 53 in the second device region 22.

Another embodiment of the present invention is now described with reference to FIGS. 11–19. In the previous embodiment depicted in FIGS. 1–10, the first strained semiconductor layer 43 can be vertically offset from the second strained semiconductor layer 44 by a vertical dimension ranging from about 50 Å to about 200 Å. The embodiment of the present invention depicted in FIGS. 11–19 provides a substantially planar strained SGOI substrate comprising device regions separated by insulating material, in which each device region has a crystallographic orientation and internal stress that is optimized for a specific type of semiconducting device. Similar to the previous embodiment depicted in FIGS. 1–10, this embodiment of the inventive method can provide a first device region that is optimized for pFET devices and a second device region that is optimized for nFET devices, or alternatively a first device region optimized for nFETs and a second device region optimized for pFETs.

Figure 11:
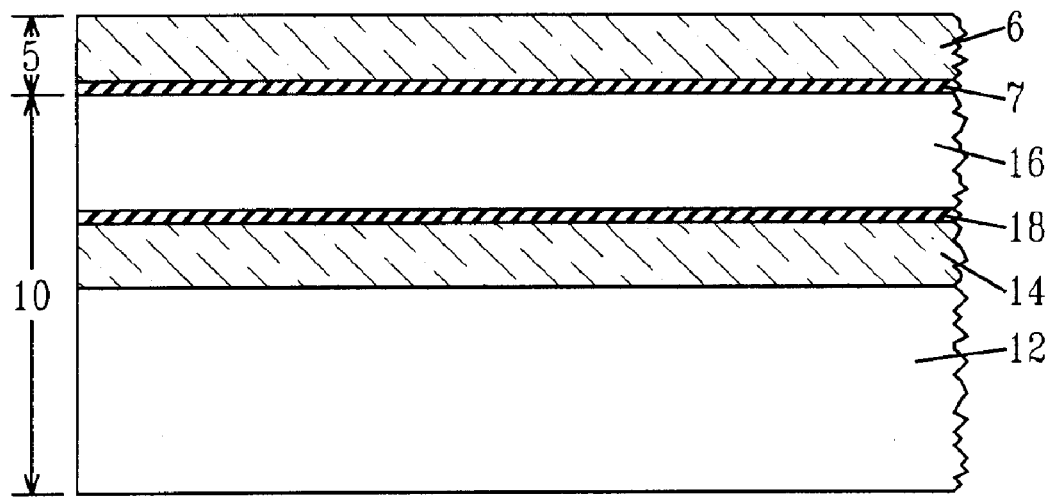
FIGS. 11–19 are pictorial representations (through cross sectional views) illustrating the basic processing steps utilized in another embodiment of the present invention to form a substantially planar SGOI substrate having a strained SGOI layer having multiple crystallographic orientation planes.

Reference is first made to the initial structure shown in FIG. 11. The initial structure comprises a bonded substrate 10 similar to the substrate depicted FIG. 1 of the previous embodiment, including a first semiconductor layer 16, a first insulating layer 14, a second semiconductor layer 12, and further comprising a first planarization stop layer 18. The planarization stop layer 18, which is located between the first insulating layer 14 and the first semiconductor layer 16, has a thickness ranging from about 5 nm to about 20 nm, with a thickness of about 10 nm being highly preferred. The planarization stop layer 18 is a nitride or oxynitride material, preferably $Si_3N_4$.

Similar to the first embodiment, the first semiconductor layer 16 has a first crystallographic orientation preferably having a (100) crystal plane and the second semiconductor layer 12 has a second crystallographic orientation that is preferably a (110) crystal plane. The first semiconductor layer 16 may alternatively have a (111) crystal plane, a (110) crystal plane or other crystal planes and the second semiconductor layer 12 may alternatively have a (111) crystal plane, a (100) crystal plane or other crystal planes. In this embodiment, the first insulating layer 14 is preferably an oxide, such as $SiO_2$.

Still referring to FIG. 11, a dielectric stack 5 is then formed atop the first semiconductor layer 16. The dielectric stack 5 includes at least a second insulating layer 6 and a second planarization stop layer 7 and can be formed using deposition processes well known in the art. The second insulating layer 6 may comprise an oxide, nitride, oxynitride or other insulating material, preferably being $SiO_2$, and may be formed using a deposition process, such as, for example, chemical vapor deposition. The second insulating layer 6 can have a thickness from about 10 nm to about 500 nm, with a thickness from about 20 nm to about 100 nm being more highly preferred.

The second planarization stop layer 7 is a nitride or oxynitride material, preferably $Si_3N_4$, and can be formed using a conventional deposition process, such as chemical vapor deposition. The second planarization stop layer 7 can have a thickness ranging from about 5 nm to about 20 nm, with a thickness of about 100 nm being highly preferred.

Following the formation of the dielectric stack 5, an etch mask is formed using conventional photoresist deposition and photolithography processes on a predetermined portion of the second insulating layer 6, so as to protect a portion of the dielectric stack 5 and the underlying bonding substrate 10, while leaving another portion of the dielectric stack 5 and the bonded substrate 10 unprotected. The unprotected portion of the bonded substrate 10 defines a first device area of the structure, whereas the protected portion of the bonded substrate 10 defines a second device region. After providing the etch mask, the structure is subjected to one or more etching steps, so as to expose a surface of the second semiconductor layer 12. The etch mask 20 is then removed utilizing a conventional resist stripping process. Following etch mask removal, a remaining portion of the second insulating layer 6 is removed using an etch process having a high selectivity to removing the second insulating layer 6, without substantially etching the second planarization stop layer 7.

Figure 12:
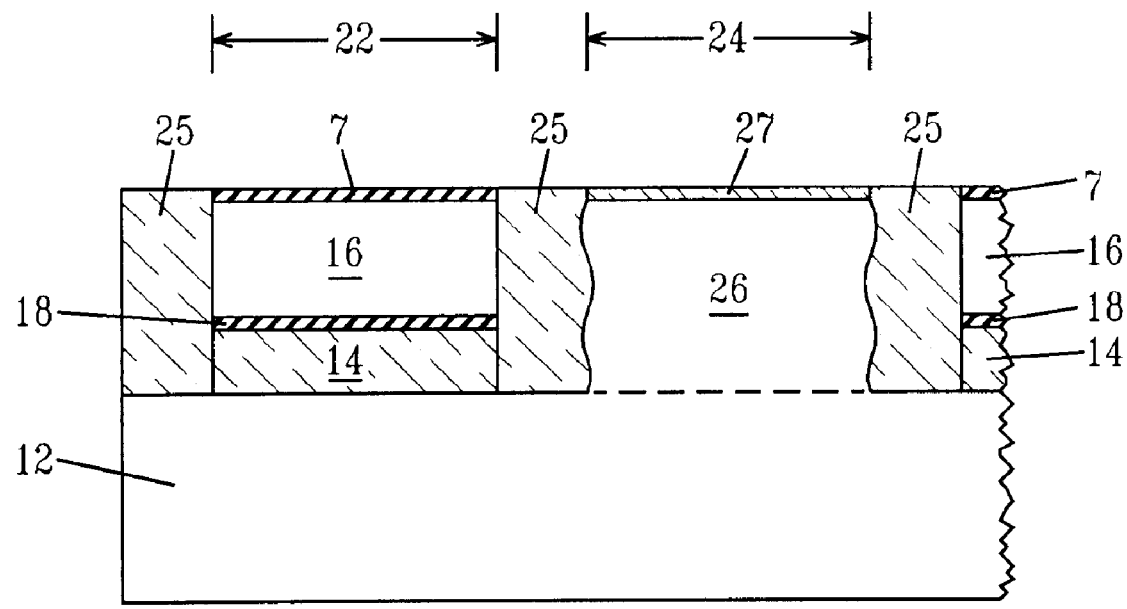

Referring to FIG. 12, an insulating material 25 is then formed atop, and on, the exposed sidewalls of the remaining portions of the second planarization stop layer 7, the first semiconductor layer 16, the second planarization stop layer 18 and the first insulating layer 14, in the second device region 22. The insulating material 25 is similar to the insulating material 25 of the previous embodiment, as depicted in FIG. 2.

In a next process step, a semiconductor material 26 is then epitaxially grown in the first device region 24, on the exposed surface of the second semiconductor layer 12. In accordance with the present invention, semiconductor material 26 has a crystallographic orientation that is the same as the crystallographic orientation of the second semiconductor layer 12. The epitaxially grown semiconductor material 26 is similar to the regrown semiconductor material 26 of the previous embodiment, which is described above and depicted in FIG. 3. In the present embodiment, the semiconductor material 26 may be referred to as a regrown semiconductor material 26, wherein the regrown semiconductor material 26 preferably comprises a crystallographic orientation having a (110) crystal plane.

Still referring to FIG. 12, a planarization process, such as chemical mechanical polishing (CMP) or grinding, is then conducted such that the upper surface of the regrown semiconductor material 26 is substantially planar with the upper surface of the second planarization stop layer 7. A first oxidation layer 27 is then formed atop the semiconductor material 26 so that the first device region 24 has a surface substantially coplanar to the second planarization stop layer 7. The first oxidation layer 27 is formed by a thermal oxidation of Si process (local oxidation of silicon (LOCOS)) and can have a thickness ranging from about 10 nm to about 15 nm. Similar to the damaged interface 28 formed in the previous embodiment and illustrated depicted in FIG. 4, a damaged interface is formed within the second semiconductor layer 12.

In a next process step, the upper surface of the structure depicted in FIG. 12, including the second planarization stop layer 7 and the first oxidation layer 27, are processed to provide a planar surface for wafer bonding. Prior to bonding, the first planarization stop layer 7 can be removed using a high selectivity etch process, without substantially etching the first semiconductor layer 16, insulating material 25, and first thermal oxide layer 27.

Figure 13:
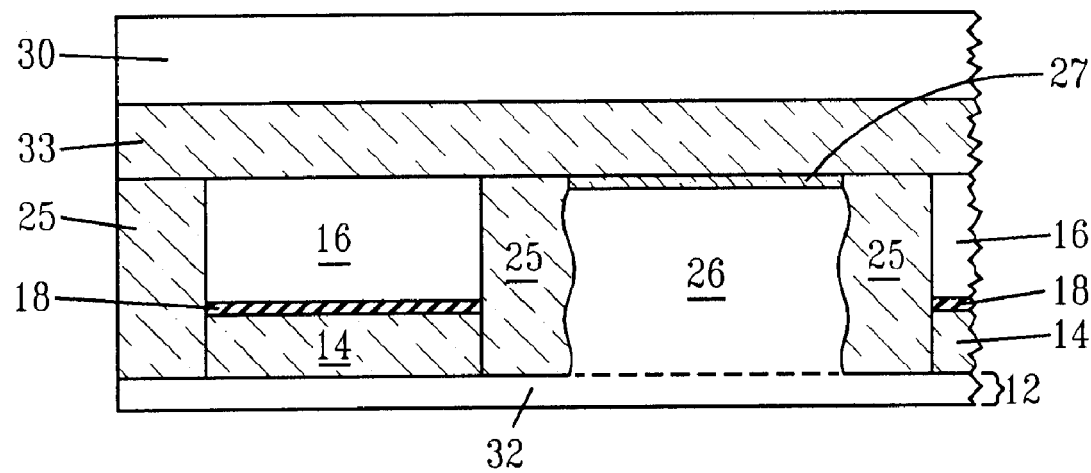

Referring to FIG. 13, in a next process step, a planar bonding layer 33 is formed using deposition and planarization atop the exposed surface of the first semiconducting layer 16, the first thermal oxide layer 27, and the insulating material 25. A wafer 30 is then bonded to the planar bonding layer 33 by conventional thermal bonding. The formation of the planar bonding layer 33 and bonding the planar bonding layer to the wafer 30 are described in greater detail in the previous embodiment, as described with reference to FIG. 4. The second semiconducting layer 12 is then separated about the damaged interface 28, in which a remaining portion 32 of the second semiconducting layer 12 remains, as depicted in FIG. 13.

The remaining portion 32 of the single orientation layer 12 is then subjected to a planarization process, such as chemical mechanical polishing (CMP) or grinding. The planarization process removes the remaining portion 32 of the single orientation layer 12, the first insulating layer 14, a portion of the insulating material 25, and a portion of the regrown semiconducting material 26. The planarization process ends on the first planarization stop layer 18.

Figure 14:
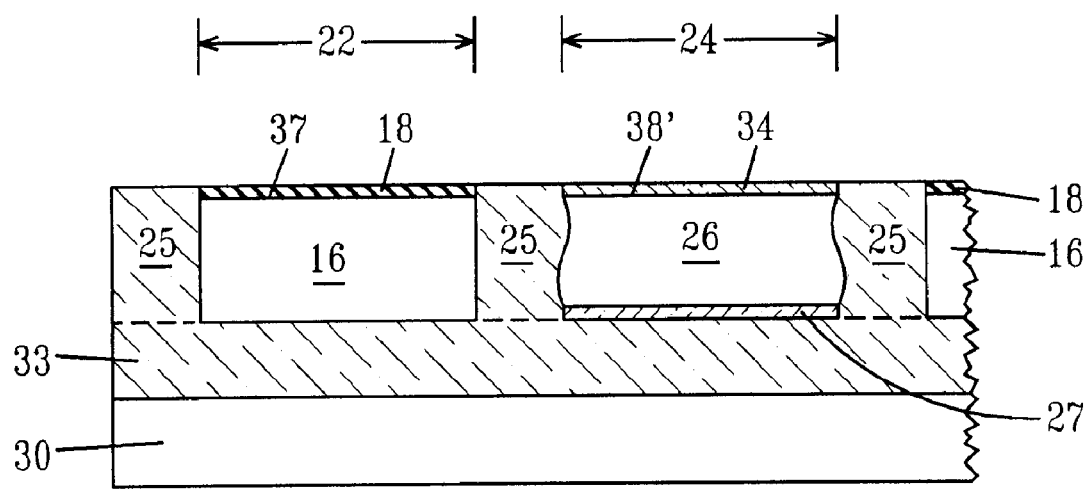

Referring to FIG. 14, in a next process step, a second thermal oxide layer 34 is formed atop the exposed surface 38' of the regrown semiconducting material 26 so that the regrown semiconducting material 26 in the first device region 24 has a surface substantially coplanar to the first semiconductor layer 6 in the second device region 22. The second thermal oxide layer 34 is formed during by a thermal oxidation of Si process. The second thermal oxidation consumes Si from the exposed surface 38' of the regrown semiconducting material 26, therefore leveling the upper surface 38' of the regrown semiconducting material 26 in the first device region 24 to the upper surface 37 of the first semiconductor layer 16 in the second device region 22. The second thermal oxide layer 34 can have a thickness ranging from about 10 nm to about 15 nm, so long as the top surface 38' of the regrown semiconducting material 26 is substantially coplanar to the top surface 37 of the first semiconductor layer 16. Preferably, the second thermal oxide layer 34 is $SiO_2$.

Figure 15:
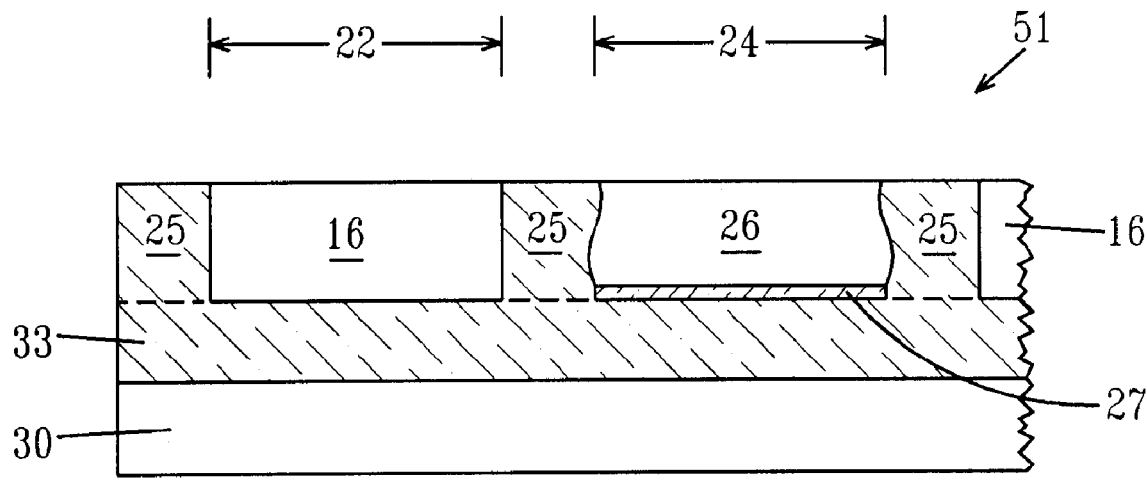

Referring to FIG. 15, in a next process step, the second thermal oxide layer 34 and the first planarization stop layer 18 are removed using a selective etching process, wherein the resulting structure comprises a substantially planar SOI substrate 51 comprising a first device region 24 having a first crystallographic orientation and a second device region 22 having a second crystallographic orientation, the first crystallographic orientation being different from the second crystallographic orientation. The first device region 24 and the second device region 22 are separated by insulating material 25. Preferably, the first orientation is a (110) crystal plane and the second orientation is a (100) crystal plane.

Figure 16:
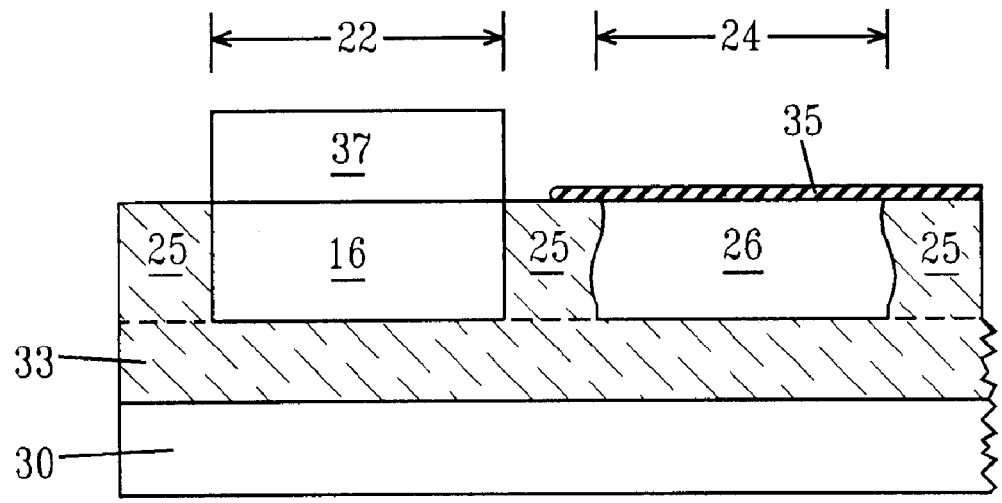

Referring to FIG. 16, a protective layer 35 is then formed atop the first device region 24 using deposition, photolithography and etching. The protective layer 35 comprises an insulating material, preferably a nitride material, such as $Si_3N_4$. The protective layer 35 may have a thickness ranging from about 10 nm to about 20 nm.

Still referring to FIG. 16, in a next process step, a second SiGe layer 37 is grown atop the first semiconductor layer 16 in the second device region 22. The second SiGe layer 37 is grown using a selective epitaxial growth process similar to the second SiGe layer 34 formed in the previous embodiment, as described above with reference to FIG. 7. The second SiGe layer 37 is preferably grown having a second Ge concentration selected to produce the appropriate stress for a nFET device within the subsequently formed second strained semiconducting layer. Alternatively, the Ge concentration is selected to produce the appropriate stress for a pFET device within the subsequently formed second strained semiconducting layer.

Figure 17:
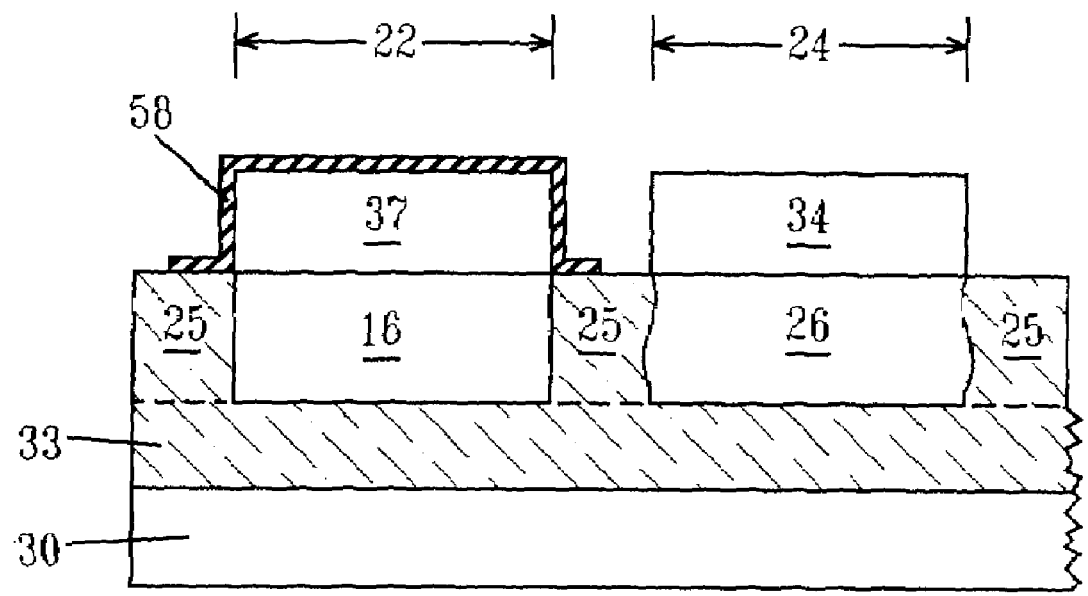

Referring to FIG. 17, the protective layer 35 is then removed by a highly selective etch that removes the protective liner 35 without substantially etching the second SiGe layer 37, the first SiGe layer 26, or the insulating material 25. A protective liner 58 is then formed atop the second device region 22 including the second SiGe layer 37 using deposition, photolithography, and etch processes, which are well known within the skill of the art. The protective liner 58 comprises an insulating material, preferably a nitride material, such as $Si_3N_4$, and may have a thickness ranging from about 10 nm to about 20 nm.

In a next process step, the first SiGe layer 34 is grown atop the exposed surface of the regrown semiconducting material 26 in the first device region 24 using a selective epitaxial growth process. The first SiGe layer 34 is grown using a selective epitaxial growth process similar to the first SiGe layer 34 formed in the previous embodiment, as described above with reference to FIG. 7. The first SiGe layer 34 is preferably grown having a first Ge concentration selected to produce the appropriate stress for a pFET device within the subsequently formed first strained semiconducting layer 43. Alternatively, the Ge concentration is selected to produce the appropriate stress for an nFET device within the subsequently formed first strained semiconducting layer 43.

Figure 18:
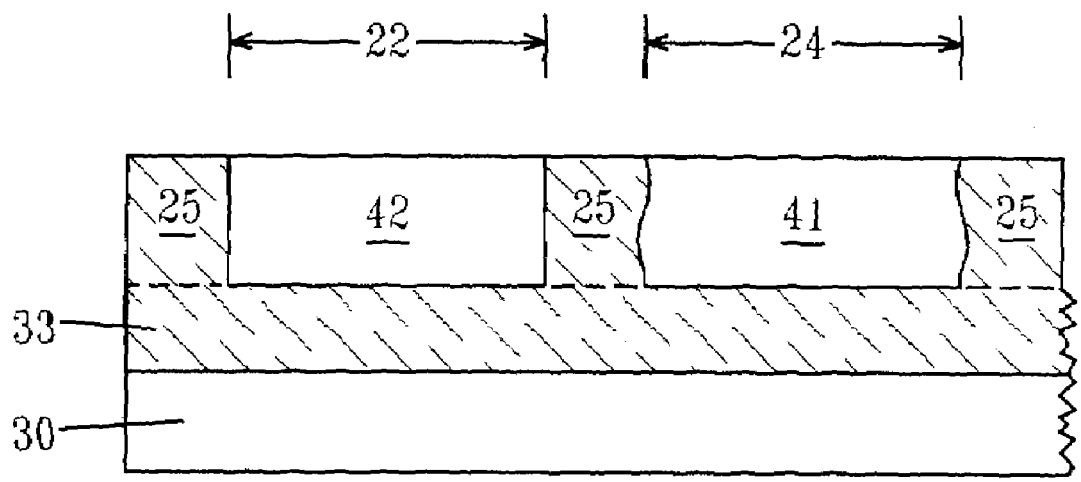

Referring now to FIG. 18, the structure is then annealed to intermix the first SiGe layer 34 with the regrown semiconducting material 26 to form a first lattice dimension SiGe layer 41 and to intermix the second SiGe layer 37 with the first semiconductor layer 16 to form a second lattice dimension SiGe layer 42. This annealing process is similar to the annealing process of the previous embodiment, described above with reference to FIGS. 8 and 9. To reiterate, an oxidizing atmosphere produces a first thermal oxide 39 atop the first device region 24 and a second thermal oxide 40 atop the second device region 22, where the formation of the thermal oxide 39, 40 drives Ge from the first SiGe layer 34 and the second SiGe layer 37 into the regrown semiconducting layer 26 and the first semiconductor layer 16. The first thermal oxide 39 and the second thermal oxide 40 are then removed using highly selective etch processes to expose the first lattice dimension SiGe layer 41 and the second lattice dimension SiGe layer 42, as depicted in FIG. 18. Due to this high temperature annealing (i.e., 1000° C.–1300° C.), the first lattice dimension SiGe layer 41 and the second lattice dimension SiGe layer 42 are relaxed.

The first lattice dimension SiGe layer 41 preferably has a lattice dimension that produces the appropriate strain for pFET device improvements in the subsequently formed first strained semiconductor layer. The second lattice dimension SiGe layer 42 has a lattice dimension that produces the appropriate strain in the subsequently formed second strained semiconductor layer for optimized performance in nFET devices. The first lattice dimension material may be SiGe having a Ge concentration ranging from 0.05% to 0.4% and the second lattice dimension material may be SiGe having a Ge ranging from about 0.1% concentration to about 0.5%.

The crystallographic orientation of the regrown semiconductor material 26 and the epitaxially grown first SiGe layer 34 is maintained in the first lattice dimension SiGe layer 41. The crystallographic orientation of the first semiconductor layer 16 and the epitaxially grown second SiGe layer 37 is maintained in the second lattice dimension SiGe layer 42.

Figure 19:
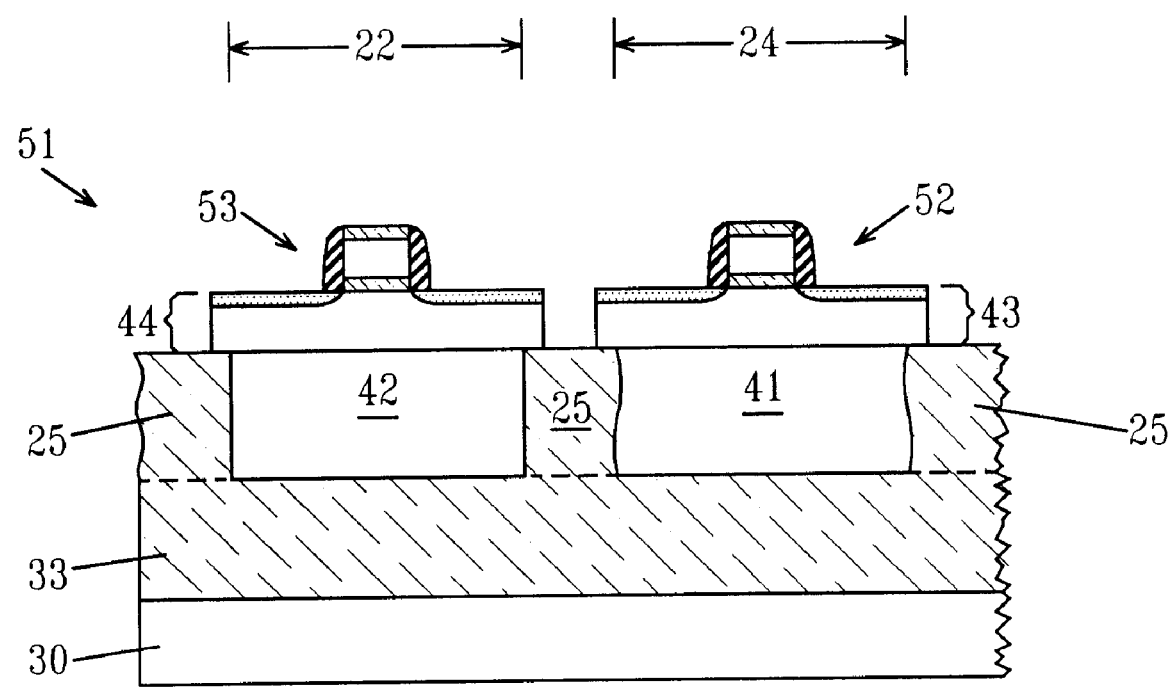

Referring to FIG. 19, in a next process step, a first strained semiconducting layer 43 is epitaxially grown atop the first lattice dimension SiGe layer 41 and a second strained semiconducting layer 44 is epitaxially grown atop the second lattice dimension SiGe layer 42. The first and second strained semiconducting layers 43, 44 comprise epitaxially formed Si.

Similar to the previous embodiment, the first and second strained semiconducting layers 43, 44 comprise an internal tensile stress that results from the lattice mismatch between the smaller lattice dimension of epitaxially grown Si of the first and second semiconducting layers 43, 44 being formed atop the larger lattice dimension of the first and second lattice dimension SiGe layer 41, 42.

Preferably, the lattice mismatch between unstrained semiconducting layer 43 and the first lattice dimension SiGe layer 41 increases pFET device improvements and the lattice mismatch between the unstrained semiconducting layer 44 and the second lattice dimension SiGe layer 41 does not degrade nFET performance. The strain produced in the first or second strained semiconducting layer 43, 44 is maintained so long as the first or second strained semiconducting layer 43, 44 is not grown to a thickness greater than its critical thickness.

In a preferred embodiment, the crystallographic orientation of the first lattice dimension SiGe layer 41 is (110). Although a (110) crystal plane is preferred, the first lattice dimension SiGe layer 41 may alternatively have a (111) or a (100) crystal plane. Since the first lattice dimension SiGe layer 41 is preferably in a (110) crystal plane, the crystallographic orientation of the second lattice dimension SiGe layer 42 is preferably in a (100) crystal plane. Although a (100) crystal plane is preferred, the second lattice dimension SiGe layer 42 may alternatively have a (111) or a (110) crystal plane.

Still referring to FIG. 19, the resulting structure comprises a substantially planar SOI substrate including a first device region 24 having a first strained semiconducting layer 43 with a first crystallographic orientation and a second device region 22 having a second strained semiconducting layer 44 with a second crystallographic orientation, the first crystallographic orientation being different from the second crystallographic orientation. Preferably, the first strained semiconducting layer 43 has a crystallographic orientation and internal tensile stress for pFET device optimization. The second strained semiconducting layer 44 of the second device region 22, preferably has a crystallographic orientation and internal stress for nFET device optimization. The substantially planar substrate 51 may then be further processed using conventional MOSFET processing steps to form at least one pFET device 52 in first device region 24 and at least one nFET device 53 in the second device region 22.

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims.

What is claimed is:

1. A method of forming a semiconductor substrate comprising:
providing an initial structure having a first device region and a second device region positioned on and separated by an insulating material, said first device region comprising a first orientation material and second device region comprising an insulating layer atop a second orientation material;
wherein said first orientation material and said second orientation material have a different crystallographic orientation;
forming a first concentration of lattice modifying material atop the first orientation material;
removing said insulating layer;
forming a second concentration of said lattice modifying material atop said second orientation material;
intermixing said first concentration of lattice modifying material with said first orientation material to produce a first lattice dimension surface and said second concentration of lattice modifying material with said second orientation material to produce a second lattice dimension surface; and
forming a first strained semiconducting layer atop said first lattice dimension surface and a second strained semiconducting layer atop said second lattice dimension surface, wherein said first strained semiconducting layer and said second strained semiconducting layer have said different crystallographic orientation.

2. The method of claim 1 wherein said first strained semiconducting layer has a (110) crystallographic orientation and said second strained semiconducting layer has a (100) crystallographic orientation.

3. The method of claim 2 wherein said first concentration of lattice modifying material comprises SiGe having a Ge concentration ranging from about 0% to about 100%, by atomic number % and said second concentration of lattice modifying material comprises SiGe having a Ge concentration ranging from about 0% to about 100%, by atomic number %.

4. The method of claim 3 wherein said first concentration of lattice modifying material is different than said second concentration of lattice modifying material and said first strained semiconducting layer has a different internal stress than said second strained semiconducting layer.

5. The method of claim 3 wherein said first concentration of lattice modifying material is the same as said second concentration of lattice modifying material and said first strained semiconducting layer has a same internal stress as said second strained semiconducting layer.

6. The method of claim 1 wherein providing said initial structure comprises the steps of:
providing a bonded substrate comprising an upper layer of said second orientation material and a lower layer of said first orientation material separated by said insulating layer;
protecting a portion of said bonded substrate while leaving another portion of said bonded substrate unprotected;
etching said unprotected portion of said bonded substrate to expose a surface of said lower layer of said first orientation material;
wherein a remaining portion of said upper layer of said second orientation material and said insulating layer define said second device region;
forming insulating material around said second device region;
regrowing said first orientation material on an exposed surface of said lower layer of said first orientation material to produce said first device region;
planarizing a surface of said first orientation material of said first device region substantially planar with said remaining portion of said upper layer of said second orientation material;

producing a damaged interface in said lower layer of said first orientation material;

bonding a wafer to said surface of said first orientation material of said first device region substantially planar with said second orientation layer of said second device region;

separating said lower layer of said first orientation material at said damaged interface, wherein a damaged surface of said lower layer of said first orientation material remains; and planarizing said damaged surface until contacting said insulating layer of said second device region.

7. The method of claim 1 wherein said forming said first concentration of lattice modifying material atop said first orientation material comprises epitaxially growing SiGe atop said first orientation material.

8. The method of claim 7 wherein said forming said second concentration of lattice modifying material atop said second orientation material comprises:

forming a protective layer atop said first concentration of lattice modifying material and atop said first orientation material;

forming a photoresist mask overlying said protective layer atop said first concentration of lattice modifying material atop said first orientation material, while leaving a remaining portion of said protective layer unprotected;

removing said remaining portion of said protective layer and said insulating layer to expose said second orientation material; and epitaxially growing SiGe atop said second orientation material.

9. The method of claim 1 wherein said intermixing said first concentration of lattice modifying material with said first orientation to produce said first lattice dimension surface and said second concentration of lattice modifying material with said second orientation material to produce a second lattice dimension surface further comprises:

heating said first concentration of lattice modifying material, said first orientation material, said second concentration of lattice modifying material, and said second orientation material in an oxidizing environment to produce an oxidation layer atop said first lattice dimension surface and said second lattice dimensions surface;

forming a planarized layer atop said oxidation layer and said oxide material; and etching said planarized layer and said oxidation layer to expose said first lattice dimension surface and said second lattice dimension surface.

10. A method of forming a semiconductor substrate comprising:

providing a substantially planar structure having a first device region and a second device region positioned on and separated by an insulating material, said first device region comprising a first orientation material and said second device region comprises a second orientation material, wherein said first orientation material and said second orientation material have a different crystallographic orientation;

forming a protective layer atop said second orientation material;

forming a first concentration of lattice modifying material atop the first orientation material;

removing said protective layer to expose said second orientation material;

forming a protective liner atop said first concentration of lattice modifying material;

forming a second concentration of said lattice modifying material atop said second orientation material;

intermixing said first concentration of lattice modifying material with said first orientation material to produce a first lattice dimension surface and said second concentration of lattice modifying material with said second orientation material to produce a second lattice dimension surface; and forming a first strained semiconducting layer atop said first lattice dimension surface and a second strained semiconducting layer atop said second lattice dimension surface, said first strained semiconducting layer having a different internal stress than said second strained semiconducting layer, said second strained semiconducting layer having said different crystallographic orientation than said first semiconducting layer.

11. The method of claim 10 wherein said first strained semiconducting layer has a 110 crystal plane and said second strained semiconducting layer has a 100 crystal plane.

12. The method of claim 11 wherein said first concentration of lattice modifying material comprises SiGe having a Ge concentration ranging from about 20% to about 40%, by atomic number %, and said second concentration of lattice modifying material comprises SiGe having a Ge concentration ranging from about 5% to about 30%, by atomic number %.

13. The method of claim 10 wherein providing said substantially planar structure comprises the steps of:

providing a bonded substrate comprising an upper layer of a second orientation material atop a planarization stop layer, said planarization stop layer atop an insulating layer, wherein said insulating layer is atop a lower layer of a first orientation material;

protecting a portion of the bonded substrate while leaving another portion of the bonded substrate unprotected;

etching said unprotected portion of the bonded substrate to expose a surface of said lower layer of said first orientation material;

wherein a remaining portion of said upper layer of said second orientation material, said planarization stop layer, and said insulating layer define said second device region;

forming insulating material around said second device region;

regrowing said first orientation material on an exposed surface of said lower layer of said first orientation material to produce said first device region;

planarizing a surface of said first orientation material of said first device region substantially planar with said remaining portion of said upper layer of said second orientation material of said second device region;

producing a damaged interface in said lower layer of said first orientation material;

bonding a wafer to said surface of said first orientation material of said first device region substantially planar with said second orientation layer of said second device region;

separating said lower layer of said first orientation material at said damaged interface, wherein a damaged surface of said lower layer of said first orientation material remains;

planarizing said damaged surface until contacting said planarizing stop layer of said second device region and exposing a surface of said first device region;

oxidizing said surface of said first device region until an oxide surface of said first device region oxide layer is substantially coplanar with said planarization stop layer; and removing said oxide surface and said planarizing stop layer to expose a surface of said first orientation material of said first device region substantially planar with a surface of said second orientation material of said second device region.

14. The method of claim 10 wherein said forming said first concentration of lattice modifying material atop said first orientation material comprises epitaxially growing SiGe atop said first orientation material.

15. The method of claim 10 wherein said forming said second concentration of lattice modifying material atop said second orientation material comprises:
   forming a protective layer atop said first concentration of lattice modifying material and atop said first orientation material;
   forming a photoresist mask overlying said protective layer atop said first concentration of lattice modifying material atop said first orientation material, while leaving a remaining portion of said protective layer unprotected;
   removing said remaining portion of said protective layer; and
   epitaxially growing SiGe atop said second orientation material.

16. The method of claim 10 wherein said intermixing said first concentration of lattice modifying material with said first orientation to produce said first lattice dimension surface and said second concentration of lattice modifying material with said second orientation material to produce a second lattice dimension surface further comprises:
   heating said first concentration of lattice modifying material, said first orientation material, said second concentration of lattice modifying material, and said second orientation material in an oxidizing environment to produce an oxidation layer atop said first lattice dimension surface and said second lattice dimensions surface;
   forming a planarized layer atop said oxidation layer and said oxide material; and
   etching said planarized layer and said oxidation layer to expose said first lattice dimension surface and said second lattice dimension surface.

* * * * *